United States Patent [19]
DiSimone et al.

[11] Patent Number: 5,976,950
[45] Date of Patent: Nov. 2, 1999

[54] POLYSILICON COATED SWAMI (SIDEWALL MASKED ISOLATION)

[75] Inventors: Eugene DiSimone, Santa Clara; Paramjit Singh, Newark, both of Calif.

[73] Assignee: National Semiconductor Corporation, Santa Clara, Calif.

[21] Appl. No.: 09/119,865

[22] Filed: Jul. 21, 1998

Related U.S. Application Data

[62] Division of application No. 08/969,820, Nov. 13, 1997.

[51] Int. Cl.$^6$ .................................................. H01L 21/76
[52] U.S. Cl. .......................... 438/432; 438/221; 438/248
[58] Field of Search .................................... 438/221, 248, 438/359, 361, 391, 424, 430, 431, 432

[56] References Cited

U.S. PATENT DOCUMENTS

| | | | |
|---|---|---|---|
| 4,842,675 | 6/1989 | Chapman et al. | 156/643 |
| 5,108,946 | 4/1992 | Zdebel et al. | 438/432 |
| 5,116,779 | 5/1992 | Iguchi | 438/432 |
| 5,130,268 | 7/1992 | Liou | 438/432 |
| 5,576,241 | 11/1996 | Sakai | 438/432 |
| 5,598,019 | 1/1997 | Komori et al. | 257/397 |

FOREIGN PATENT DOCUMENTS

| | | | |
|---|---|---|---|
| 54-128298 | 10/1979 | Japan | 257/397 |

OTHER PUBLICATIONS

New Techniques for Elimination of the Bird's Head and Bird's Beak, Burton, et al., 26.3, International Electron Devices Meeting, San Francisco, CA, Dec. 9–12, 1984, pp. 582–585.

*Primary Examiner*—Charles Bowers
*Assistant Examiner*—David S Blum
*Attorney, Agent, or Firm*—Limbach & Limbach L.L.P.

[57] ABSTRACT

A side wall masked isolation (SWAMI) technique for isolating active regions on an integrated circuit involves reducing the "bird's beak" structure. The technique involves forming an isolation recess in the substrate, and then lining the recess with a layer of silicon dioxide, and then a layer of silicon nitride. Then, oxide spacers are formed on each of the sidewalls of the recess. The recess is then anisotropically etched until the substrate at the bottom of the recess is exposed. This etch process involves removing portion of both the silicon dioxide and the silicon nitride layers formed at the bottom of the recess. Subsequently, a layer of polycrystalline silicon material is deposited in the recess and is then etched back and oxidized to form a field oxide. Since the polycrystalline silicon is oxidized, the result is negligible oxide encroachment resulting in a reduction in the "bird's beak" structure.

23 Claims, 9 Drawing Sheets

POLYSILICON COATED SWAMI (SIDEWALL MASKED ISOLATION)

This application is a divisional of Ser. No. 08/969,820 filed Nov. 13, 1997.

BACKGROUND OF THE INVENTION

1. Field of the Invention

The present invention relates to technologies for isolating devices in integrated circuits and, in particular, to a poly coated sidewall-masked isolation technology.

2. Related Art

Integrated circuits are formed by interconnecting isolated devices through particular electrical paths. As a result, isolation technology is an important aspect of fabricating integrated circuits.

Since different integrated circuits have different isolation requirements, various techniques have been used to isolate devices. These various isolation techniques exhibit different attributes, with respect to minimum isolation spacing, surface planarity, process complexity, and density of defects generated during fabrication of the isolation structure. Tradeoffs can be made among these characteristics when selecting an isolation technology for a particular circuit application.

Generally, different isolation techniques are used for metal oxide semiconductor (MOS) devices and bipolar devices. Two common junction isolation techniques used in bipolar devices, are the standard buried collector (SBC) process and the collector diffused isolation (CDI) process. However, these techniques exhibit several disadvantages. Both processes utilize isolation diffusions which cause large collector-to-base and collector-to-substrate capacitances, which reduce the speed of the circuit.

In addition, both processes result in low collector-base junction breakdown voltages which limits the use of these circuits to applications requiring small power-supply voltages. The SBC process has the added disadvantage that wide isolation regions correspond to large inactive areas on the silicon surface, which can limit the packing density of the integrated circuit.

One standard industry technique used to isolate devices in p-channel MOS (PMOS) and n-channel MOS (NMOS) integrated circuits is LOCOS (LOcal Oxidation of Silicon). This technique involves forming a semirecessed oxide in the nonactive (or field) areas of the substrate.

A typical sequence of the operations involved in a conventional semi-recessed LOCOS technique is shown in FIGS. 1A–1D. The first step involves thermally growing a silicon dioxide ($SiO_2$) layer 101 on the surface of a substrate 103 of a semiconductor silicon wafer 100, as shown in FIG. 1A. This silicon dioxide layer 101, is often referred to as the pad or buffer oxide, since it operates to cushion the transition of stresses between the silicon substrate and the subsequently deposited nitride layer. In an alternative technique a CVD (chemical vapor deposition) $SiO_2$ is used instead of thermal $SiO_2$.

Next, referring to FIG. 1B, a layer of silicon nitride ($Si_{34}$) 105 is deposited on the silicon dioxide layer 101 and photolithography is used to pattern the two layers 101, 105, so that the desired isolation areas 107 are exposed, and the desired active areas 109 (i.e., those regions of the integrated circuit where active devices are to be formed) are covered with an oxidation barrier. The silicon nitride layer 105 is then dry etched, and the pad oxide 101 and the silicon substrate 103 are etched by means of either a dry or a wet chemical process, to form an isolation trench 113.

Subsequently, a field oxide 111 is thermally grown on the exposed silicon regions by using high-pressure oxidation (HIPOX), as shown in FIG. 1C. The field oxide 111 grows where there is no masking nitride 105. However, at the edges of the nitride 105, some oxygen diffuses laterally causing the field oxide 111 to grow under and lift these nitride edges. This encroachment of the field oxide layer 111 under the nitride layer 105 causes a tapering oxide wedge that merges into the pad oxide 101, and is referred to as a "bird's beak." Finally, the masking layer 105 is removed, as shown in FIG. 1D.

The conventional semi-recessed LOCOS isolation process described above has the disadvantage of leaving a bird's beak, which causes unacceptably large encroachment of the field oxide into the device active regions. This in turn reduces the packing density and active area available for making the devices. In addition, the growth of the field oxide in the trench causes stresses that can lead to defects in the silicon. Typically, defect-generating stresses arise at the bottom corners of the etched grooves during field oxide growth and are due to the volume expansion of the growing oxide.

First, as the oxide grows, its top surface is pushed outward by the newly forming oxide layer at the silicon substrate and silicon dioxide ($SiO_2$) interface. This volume expansion causes tangential stresses in the corners of the trench. Second, as the laterally encroaching oxide grows under the nitride, it is restrained from growing upward by the stiffness of the nitride layer, causing further stress downward against the silicon in the corner of the recess. These stresses, if not relieved, can generate dislocations in the silicon such as line defects and stacking faults.

Another conventional isolation technique is the sidewall-masked isolation (SWAMI) technique, as shown in FIGS. 2A–2F. This technique offers two significant advantages over the conventional semi-recessed LOCOS: reduction of the bird's beak structure and an increase in packing density due to the reduction of lateral oxide encroachment. This technique involves forming a pad-oxide layer 101 and a CVD-nitride layer 105 on top of the silicon substrate 103, and then etching these three layers in the same manner as in conventional Semi-recessed LOCOS to form isolation trench 113, as shown in FIGS. 1A–1B.

Subsequently, as shown in FIG. 2A, a second stress-relief oxide layer 201 is grown followed by the deposition of a second CVD nitride layer 203, which provides conformal coverage of the entire surface, including the sidewalls of the silicon trench 113. Then a CVD oxide 205 is deposited on the second CVD nitride layer 203, as shown in FIG. 2B. All three layers 201, 203, 205 are then anisotropically etched in the field region such that the layers 201, 203, 205 remain only on the sidewalls of the trench and in the corners of the trench (foot), as shown in FIG. 2C. The CVD oxide 205 forms a spacer that protects only part of the second nitride layer 203, and this nitride layer 203 forms a structure with a foot that extends partway into the exposed silicon at the bottom of the trench 113. Typically, the oxide sidewall spacer 207 is removed. After the oxide spacer has been etched away, the final structure is a silicon mesa whose sidewalls are surrounded by the second nitride layer 203 and oxide 201, as shown in FIG. 2D.

In the next step, the field oxide is grown and the thin sidewall nitride 203 is bent upward due to the expansion of the converted $SiO_2$ oxide 211, as shown in FIG. 2E. As the oxide expands, the sidewall nitride 203 continues to bend upward as shown in FIG. 2F. Finally the masking nitride layers are removed. This process reduces the bird's beak structure and achieves a relatively planar surface topography.

Although this process is an improvement over the conventional LOCOS isolation technique, this process has some disadvantages. First, the sidewall nitride 203 rises during oxidation, allowing for some encroachment although it is less than that in conventional LOCOS. In addition, this process yields excessive stresses at the corners of the trench, since oxide growth in that region is restrained due to nitride compression.

Another technique for eliminating the bird's beak is described in an article entitled "New Techniques for Elimination of the Bird's Head and Bird's Beak," by Burton et al., 1984, *IEDM*, pp. 582–585, hereby incorporated by reference. This article discloses a field isolation method requiring two processing steps in addition to the conventional recessed isoplanar process, namely (1) a polysilicon sidewall spacer formation and (2) an oxide "bump" planarization. A polysilicon sidewall is used to reduce oxide encroachment during the field oxidation step. The process sequence is shown in FIGS. 1A–1B and 3A–3E.

The first steps of the technique are analogous to those shown in FIGS. 1A–1B. Subsequently, a second oxide layer 301 is grown on the trench, as shown in FIG. 3A. However, before a regular field oxidation in a recessed isoplanar technique, a polysilicon sidewall spacer 305 is formed along the sidewall of the trench region by low pressure chemical vapor deposition (LPCVD), polysilicon deposition 303 and anisotropic etchback (FIGS. 3B and 3C).

During the subsequent field oxidation, the outer layer of polysilicon along the sidewall is oxidized first and transformed into silicon dioxide 309. This method works in such a way that oxidation at the silicon nitride/silicon dioxide/silicon interface does not take place until the polysilicon sidewall spacer 305 is completely oxidized into silicon dioxide 309. The polysilicon spacer 305, by virtue of the delaying action, allows for the bird's beak to be reduced to a zero value as shown in FIG. 3D.

The oxidation of the polysilicon sidewall generates an oxide "bump" 307 at the boundary between field and active region as shown in FIG. 3D. This undesirable protrusion can be removed using some available planarization technique to yield the resulting structure shown in FIG. 3E.

Although this process sequence is an improvement over the conventional LOCUS process sequence, this process sequence requires a difficult planarization scheme.

Thus, a need exists to increase the packing density on an integrated circuit, eliminate oxide encroachment without requiring a difficult planarization scheme, and minimize the formation of stresses in the silicon, while maintaining a short processing time and low processing cost.

SUMMARY OF THE INVENTION

A technique for isolating devices in an integrated circuit includes oxidizing polycrystalline silicon formed in an isolation trench, rather than oxidizing monocrystalline silicon. The technique involves forming a layer of oxide-resistant masking material, such as silicon nitride, over the active regions of the silicon substrate and etching the field regions to expose the silicon to form a shallow trench in the field region. Then an oxide is grown on the silicon trench and a second oxide-resistant layer is deposited to line the trench. Subsequently, a dielectric spacer is formed on the sidewalls of the trench, the structure is etched to expose the silicon substrate at the bottom of the trench, and then a layer of polysilicon is deposited both in the trench and on the active regions. The polysilicon is then planarized and oxidized (or oxidized and planarized), and the first oxide-resistant layer is removed from the active regions of the substrate.

This technique provides several benefits. First, the nitride liner in the trench stops bird's beak encroachment caused during oxidation. Second, since predominately the polycrystalline silicon is oxidized, negligible stresses occur in the monocrystalline substrate. When the polycrystalline silicon is oxidized, it expands to consume a larger space. As a result, the polycrystalline silicon grows upward, because the second nitride layer will prohibit lateral volume expansion into the silicon. In this manner, the nitride layer eliminates oxide encroachment causing the formation of the bird's beak structure.

Finally, another advantage of the technique is the additional packing density available in an integrated circuit. Due to the reduction of encroachment of the oxide, the devices can be placed closer together in the integrated circuit, allowing more devices to be placed in a chip.

DETAILED DESCRIPTION OF THE PREFERRED EMBODIMENT

The isolation process of a monolithic integrated circuit involves a sequence of processing steps. FIGS. 4A–4I show cross sectional views illustrating the process technique for achieving isolation of devices on an integrated circuit in accordance with one embodiment of this invention.

The isolation structure is formed after a n+buried layer and an epitaxial layer have been grown on a p-type substrate. In this embodiment, substrate 401 is doped type-N silicon. Although type-N doping is used, it will be appreciated that when a semiconductor material is used as substrate 401, either P or N conductivity type is suitable, as well as any convenient doping level. Additionally, the substrate 401 is consistent with typical silicon semiconductor substrates, although other silicon crystal orientations are suitable for use as substrate 401. Moreover, although the isolation requirements of MOS integrated circuits are somewhat different from those of bipolar integrated circuits, it will be appreciated that the isolation technique of the present invention can be used for both bipolar and MOS integrated circuits.

Figure 1A:
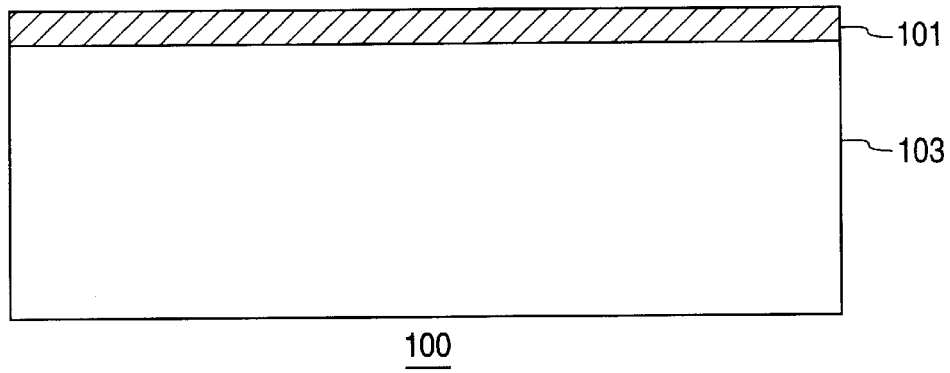
FIGS 1A–1D illustrates a conventional isolation technique.
Figure 1B:
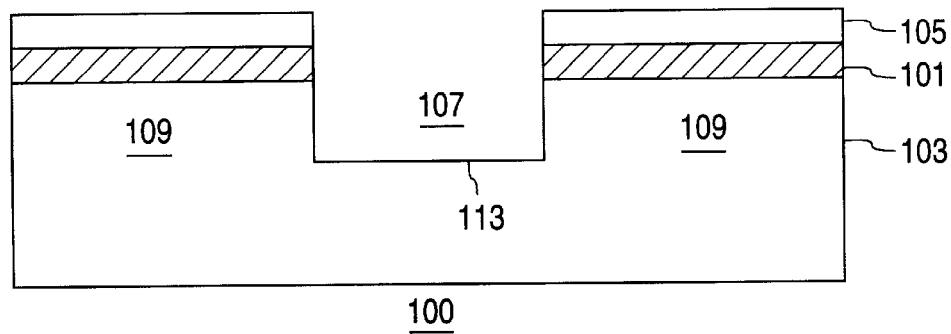
Figure 1C:
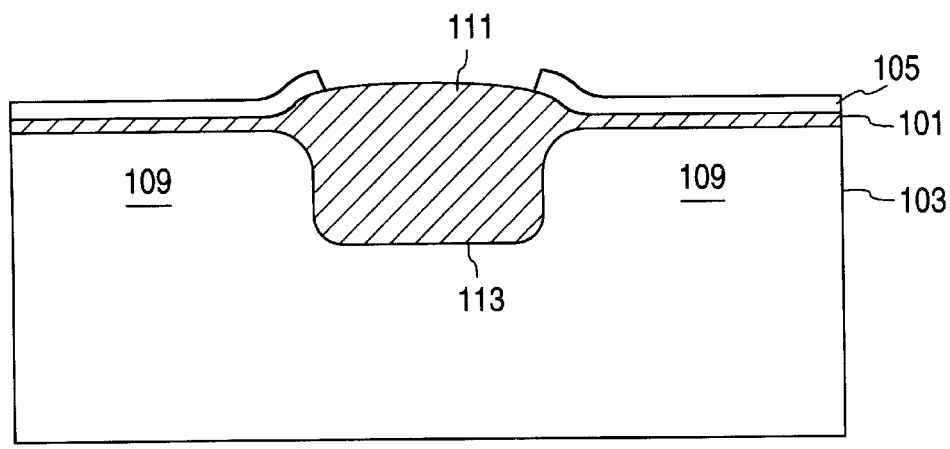
Figure 1D:
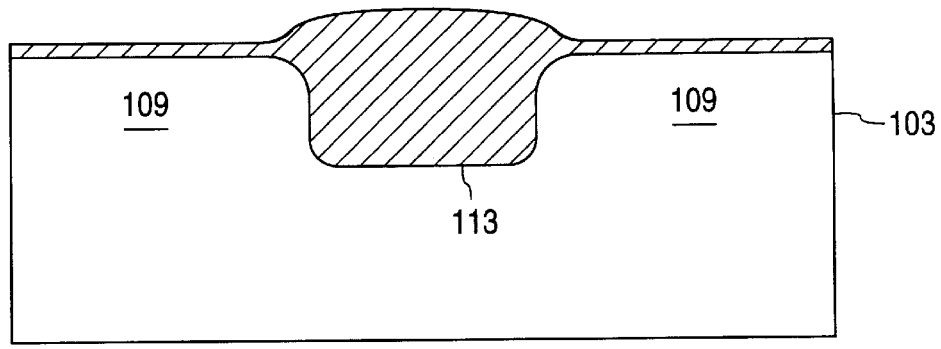
Figure 2A:
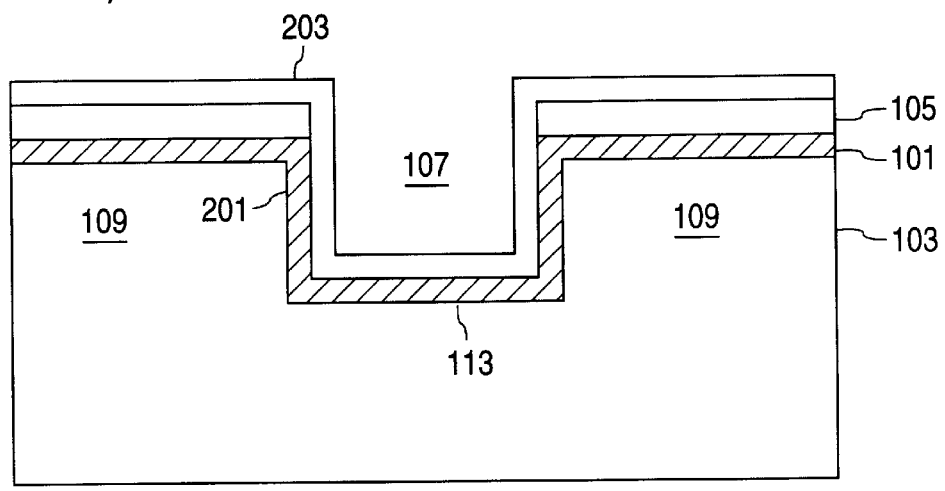
FIGS. 2A–2F illustrate another conventional isolation technique.
Figure 2B:
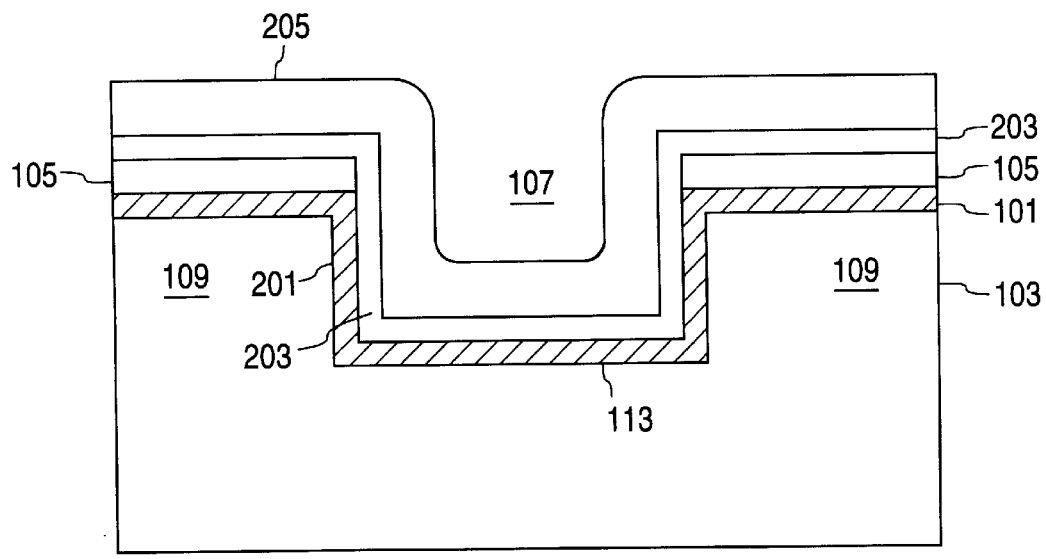
Figure 2C:
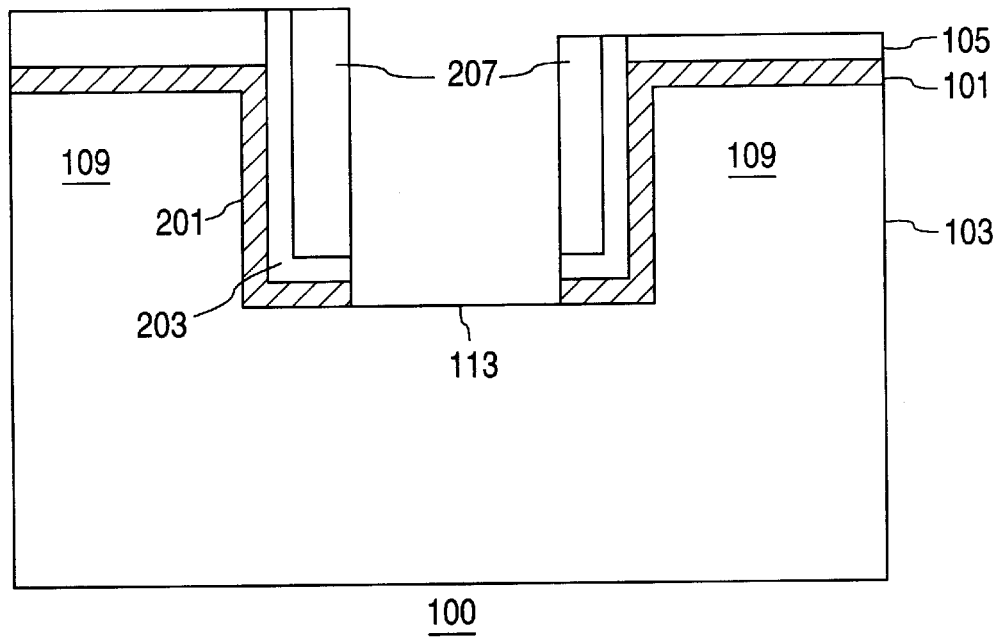
Figure 2D:
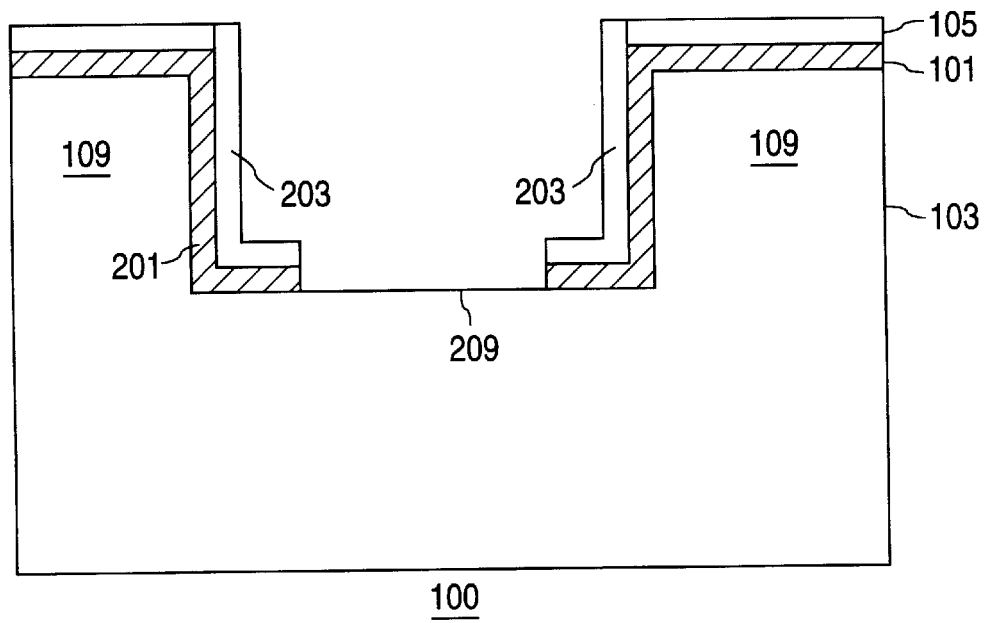
Figure 2E:
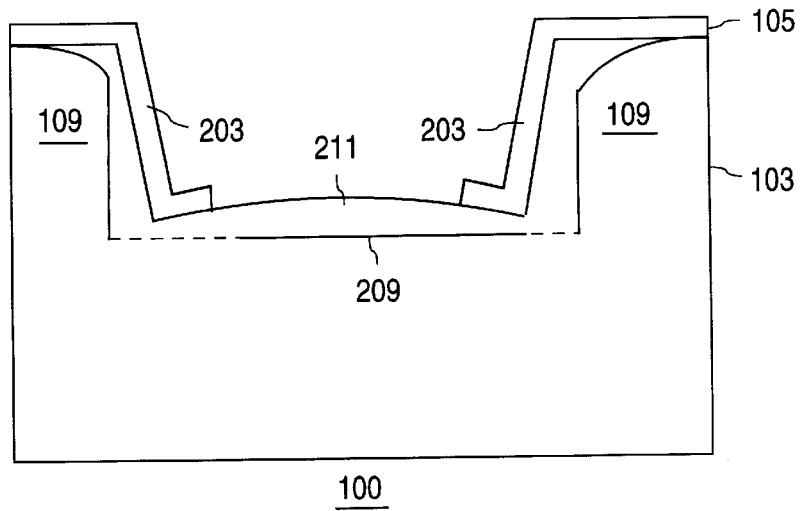
Figure 2F:
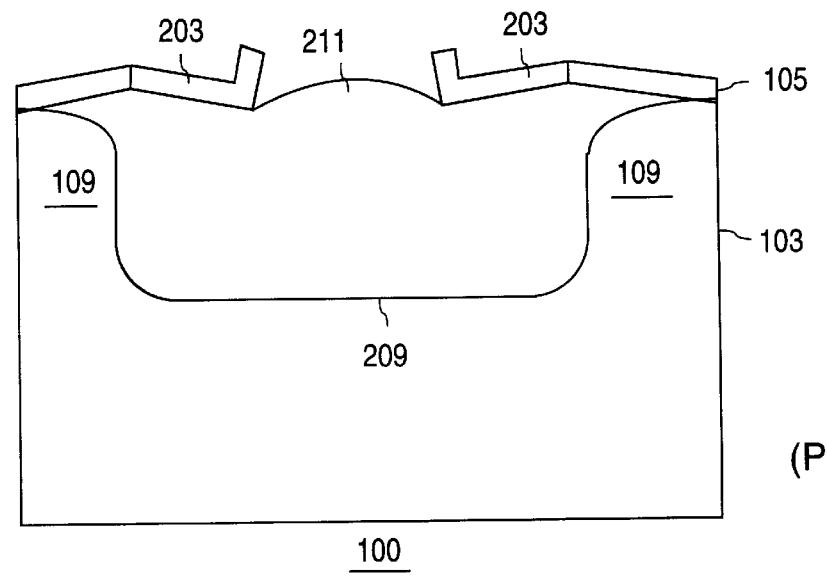
Figure 3A:
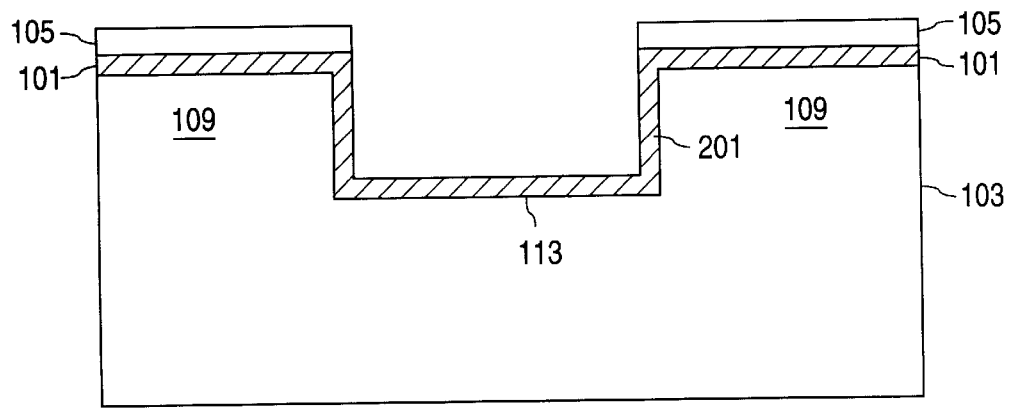
FIGS. 3A–3E illustrate another conventional isolation technique.
Figure 3B:
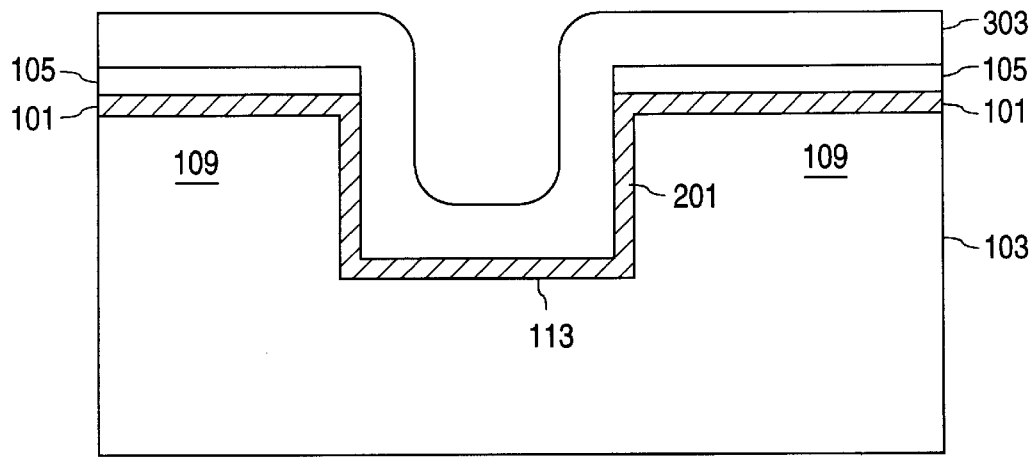
Figure 3C:
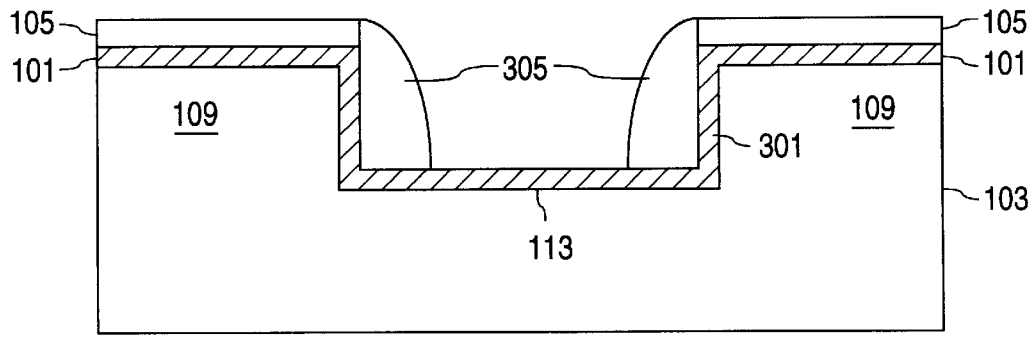
Figure 3D:
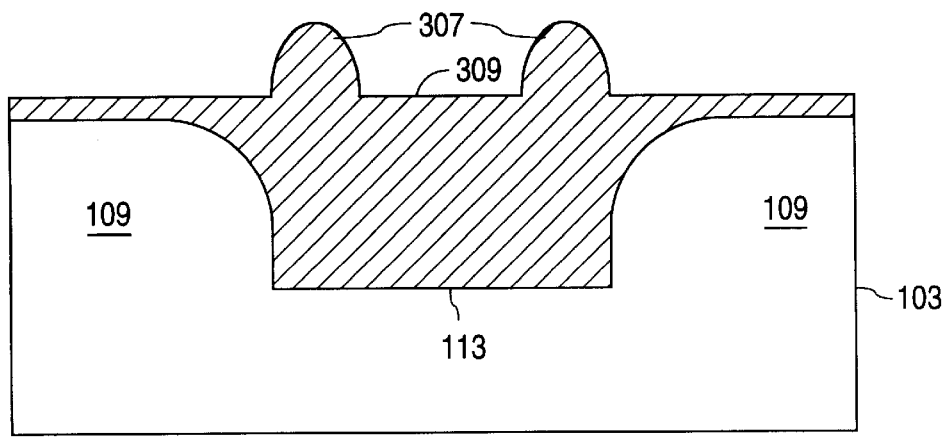
Figure 3E:
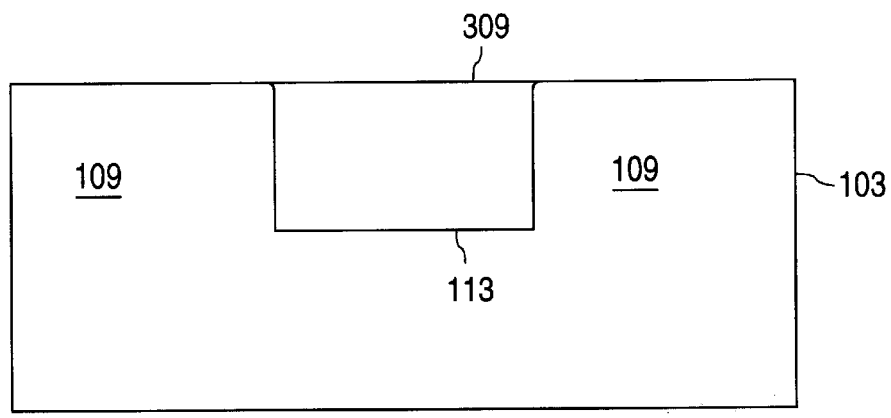
Figure 4A:
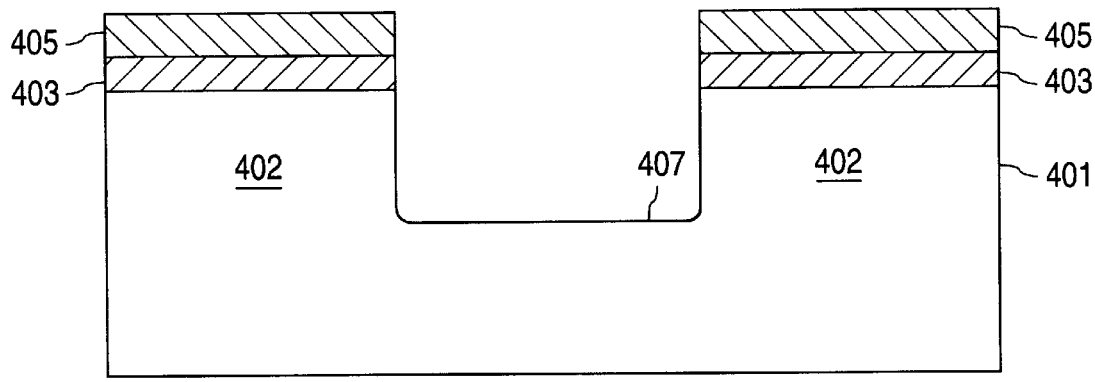
FIGS. 4A–4I illustrate an isolation technique in accordance with one embodiment of the present invention.

Referring to FIG. 4A, a layer 403 of dielectric material, typically silicon dioxide ($SiO_2$), is grown on a wafer 401 with a bare silicon surface. Subsequently, a layer of CVD nitride 405, which functions as an oxide-resistant mask 405, is deposited on the silicon dioxide layer 403. The active regions 402 of the silicon substrate are then defined with photolithography. A resist pattern is typically used to protect the areas 402 where active devices will be formed. The nitride layer 405, the silicon dioxide layer 403 and the silicon substrate, are etched to form a recess, such as an isolation trench 407, in the substrate 401.

The isolation trench 407 can be either fully recessed or shallow (partially recessed). In one embodiment, the isolation trench 407 formed is a shallow trench, for example, less than approximately one micron.

Figure 4B:
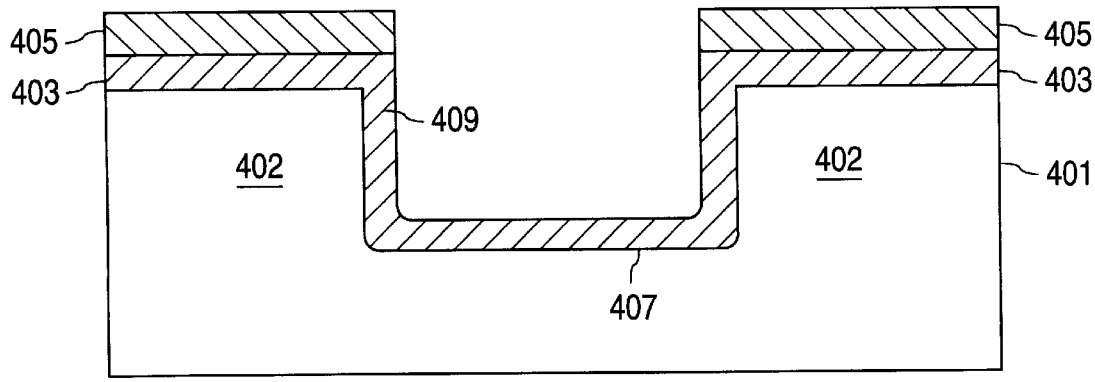
Figure 4C:
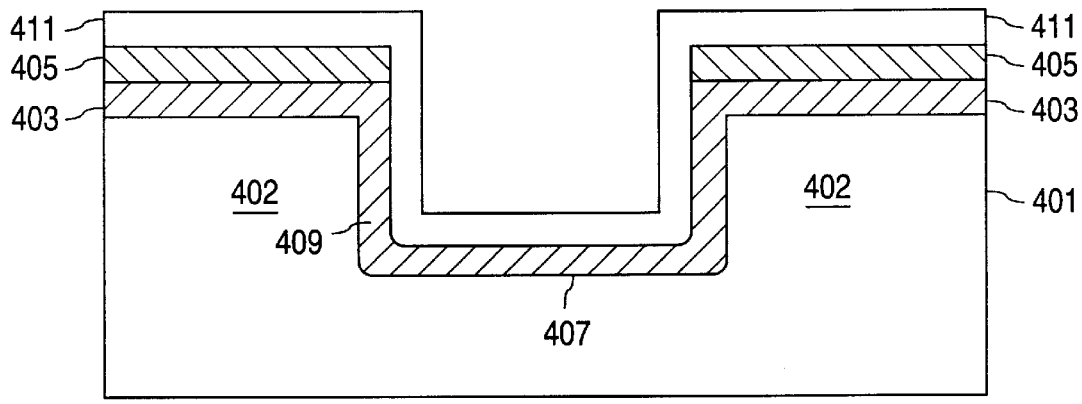

As shown in FIG. 4B, the exposed silicon in the isolation trench 407 is then oxidized by growing or depositing a layer of dielectric material 409 on the surface of the trench 407. Next, as shown in FIG. 4C, a second layer of silicon nitride 411 is deposited on the silicon dioxide layer 409 in the trench 407, and on the first nitride layer 405 above the active regions 402 of the silicon substrate 401. Typically, this second nitride layer 411 is thin.

Figure 4D:
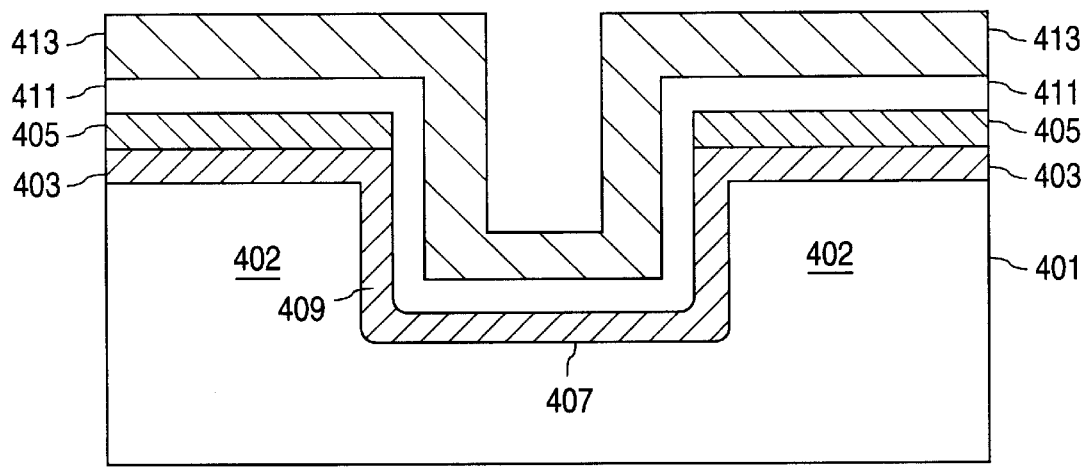
Figure 4E:
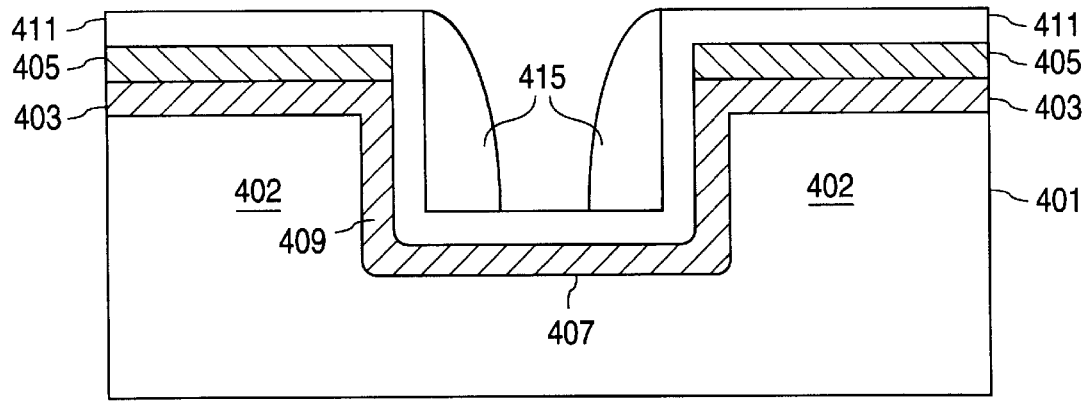

As shown in FIG. 4D, a layer of thick oxide 413 is then deposited on the second nitride layer 411. This oxide layer 413 is typically formed of tetra ethyl ortho silane (TEOS). This thick oxide layer 413 is anisotropically etched using an isoplanar etchback technique, such as a plasma etch. As a result of the etchback, only sidewalls 415 of thick oxide remain in the trench 407, as shown in FIG. 4E. These sidewalls 415 form a spacer, which protects the second nitride layer 411 lining the sidewalls and part of the bottom of the trench 407. The isoplanar etchback also clears the thick oxide 413 from the second nitride layer 411 above the active regions 402 of the silicon substrate 401, as also can be seen in FIG. 4E.

Figure 4F:
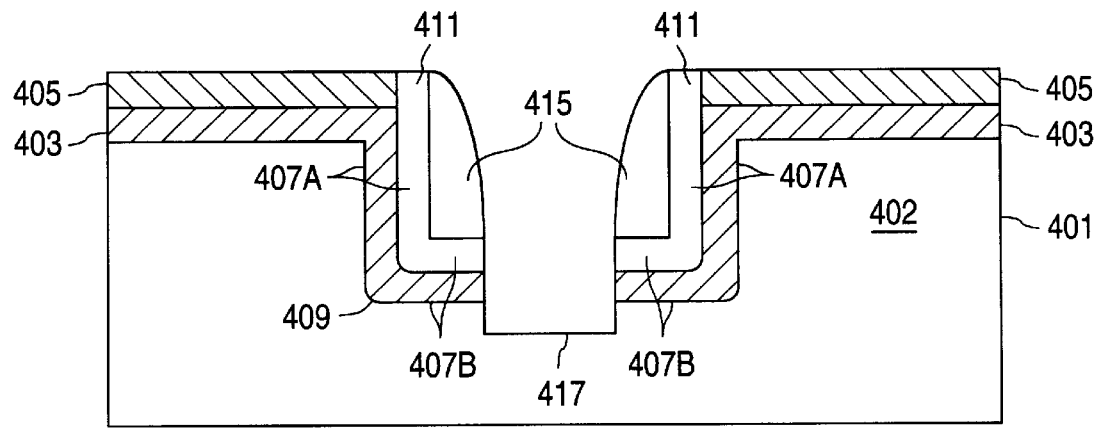

In one embodiment, a second etch process is performed to etch the trench 407 until the portion 417 of the silicon substrate 401 forming the bottom of the trench 407 is exposed, as shown in FIG. 4F. This process involves etching through the second nitride layer 411, the oxide layer 409, and a portion of the silicon substrate 401. This etching step removes those portions of the second nitride layer 411 and the oxide layer 409, not protected by the oxide spacer 415, as well as the portion of the second nitride layer 411 formed above the active regions 402 of the silicon substrate 401. As a result of this anisotropic etching, an oxide sidewall 415 remains on each leg 407A and foot 407B of the trench 407.

In another embodiment, the second etch process is performed to only etch through the second nitride layer 411. This etching step removes those portions of the second nitride layer 411, not protected by the oxide spacer 415, as well as the portion of the second nitride layer 411 formed above the active regions 402 of the silicon substrate 401. The oxide layer 409 is not removed. This anisotropic etching also leaves an oxide sidewall 415 on each leg 407A and foot 407B of the trench 407.

Figure 4G:
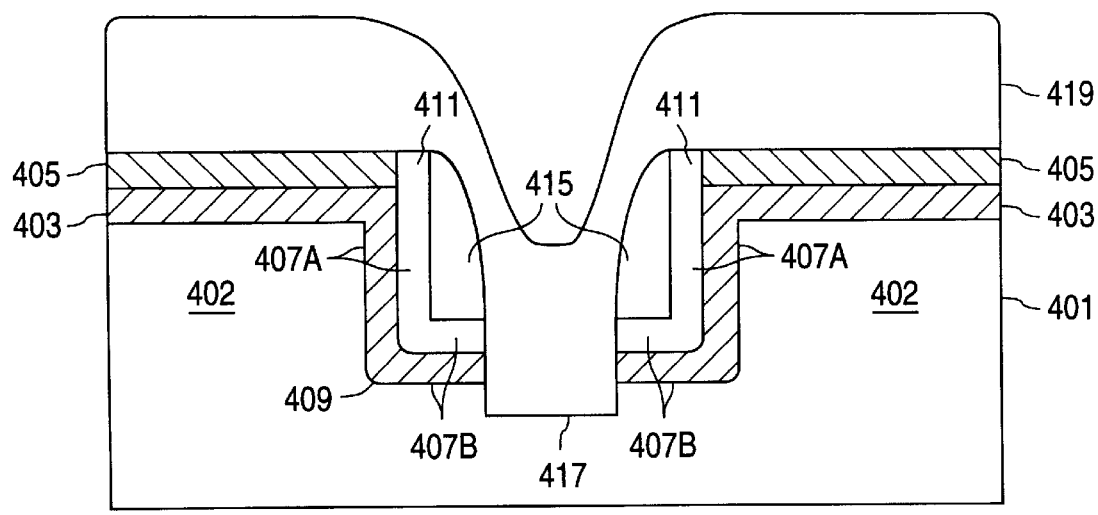

Then, as shown in FIG. 4G, a thick layer of polycrystalline silicon 419 is deposited over both the active region 402 and the isolation region, formed by the trench 407, of substrate 401. This polycrystalline silicon layer 419 coats the first silicon nitride layer 405 and the sidewall spacer 415, as well as the exposed silicon 417. In one embodiment, the polycrystalline silicon 419 thickness deposited is approximately two-thirds the depth of the trench 407. This depth provides the polycrystalline silicon 419 with room to expand upwardly during the oxidation process, thereby eliminating the undesirable oxide bump over the field regions as created by some conventional isolation processes, for example, the process disclosed in the Burton et al. reference. As noted previously, this oxide bump can cause difficulty in the planarization step.

Figure 4H:
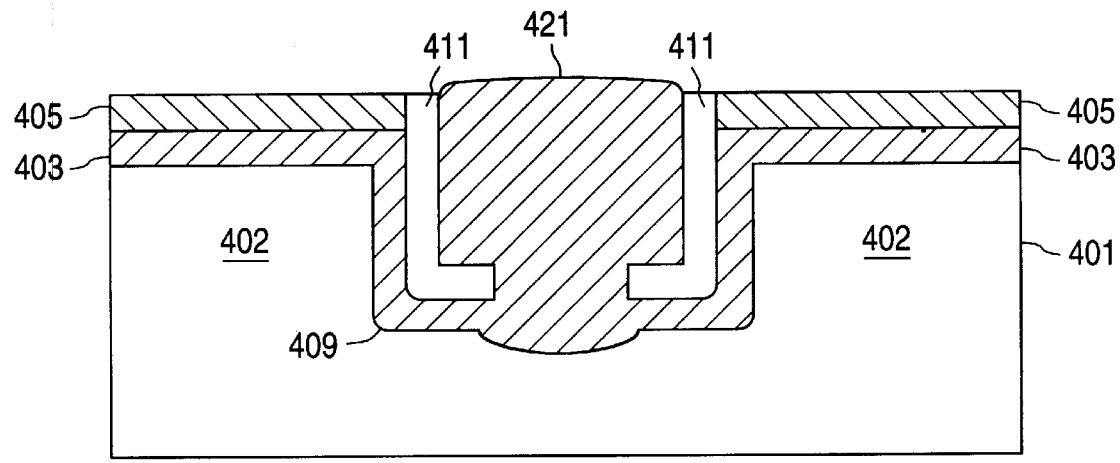

The polycrystalline silicon layer 419 is then oxidized to form a field oxide 421 and planarized to form the structure shown in FIG. 4H. In one embodiment, the polycrystalline silicon 419 is completely oxidized. Since the second silicon nitride layer 411 prevents the volume expansion of the field oxide 421 into the sides of the trench 407, the field oxide 421 expands upward, since there is no resistance in the upward direction. Thus, since the process involves predominately oxidizing the polycrystalline silicon 419 over the monocrystalline silicon 401, negligible stresses occur in the monocrystalline substrate 401 and negligible oxide encroachment cause the formation of the bird's beak structure occurs.

Then, the field oxide 421 is planarized, for example, using Resist Etch Back (R.E.B.), or oxide reflow and etchback, until the first silicon nitride layer 405 is exposed. It will be appreciated that the polycrystalline silicon 419 can either be planarized and then oxidized or oxidized and then planarized. An advantage to etching back the polycrystalline silicon 419 before oxidation, is the ease of which the isolation technique of the present invention can be integrated into a conventional chemical mechanical polishing (CMP) planarization process.

Figure 4I:
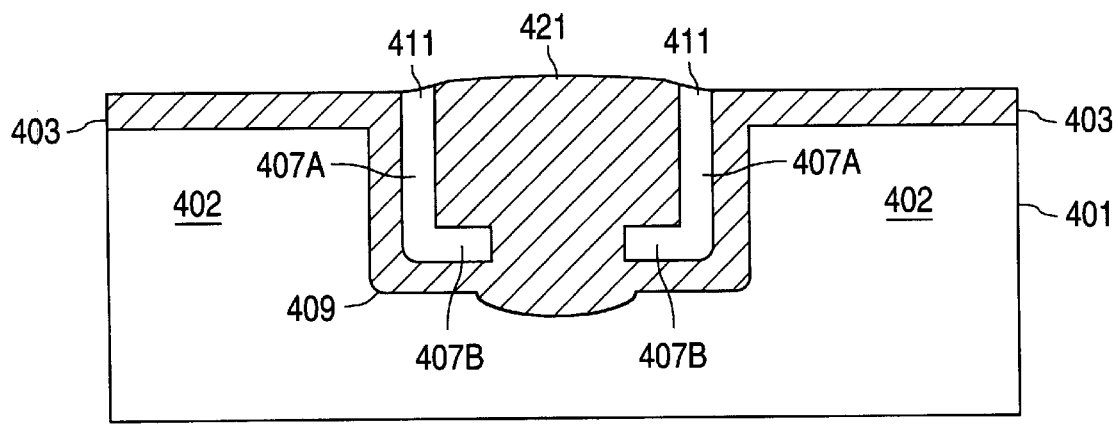

Then, as shown in FIG. 4I, the first nitride layer 405 formed above the active regions 402 is removed, leaving a partial nitride-lined isolation region. A controlled hot phosphoric nitride strip is one technique that can be used to remove the nitride layer 405 to ensure the nitride is removed from the wafer surface, yet not removed from the lining of the trench.

The result is a single isolation tub with a nitride leg 407A and foot 407B liner separating the sidewalled silicon dioxide layer 403 from the oxidized polycrystalline silicon layer 421 and with negligible oxide encroachment.

Silicon nitride is effective because oxygen and water vapor diffuse very slowly through it preventing oxidizing species form reaching the oxide layer beneath the nitride layer. In addition, the nitride itself oxidizes very slowly as the field polycrystalline oxide is grown. Thus, the nitride remains as an integral oxidation barrier layer during the entire field oxide growth step.

Various other modifications and alterations in the structure and method of operation of this invention will be apparent to those skilled in the art without departing from the scope and spirit of this invention. Although the invention has been described in connection with specific preferred embodiments, it should be understood that the invention as claimed should not be unduly limited to such specific embodiments.

What is claimed is:

1. A method for isolating regions of an integrated circuit comprising the steps of:
    forming a first recess in a substrate;
    forming a first dielectric layer in the first recess;
    depositing a first oxide-resistant layer on the first dielectric layer;
    forming an oxide layer on the first oxide-resistant layer, wherein the first dielectric layer, the first oxide-resistant layer and the oxide layer together form a second recess within the first recess;
    exposing a portion of the substrate via the first and second recesses;
    depositing a semiconductor material on the exposed substrate portion and in the second recess; and
    oxidizing the semiconductor material.

2. The method of claim 1, wherein the step of forming a first recess in a substrate comprises the steps of:
    forming a second dielectric layer on the surface of the substrate;
    depositing a second oxide-resistant layer on the second dielectric layer in a pattern to expose a portion of a surface of the substrate; and
    removing the exposed portion of the substrate surface to form the first recess in the substrate, the first recess including a bottom and a plurality of sidewalls.

3. The method of claim 1, wherein the step of forming an oxide layer on a portion of the first oxide-resistant layer comprises the steps of:
    depositing the oxide layer on the first oxide-resistant layer; and
    etching the oxide layer such that a portion of the oxide layer is removed from another portion of the first oxide-resistant layer.

4. The method of claim 1, wherein the step of exposing a portion of the substrate via the first and second recesses comprises removing a portion of the first oxide-resistant layer and a portion of the first dielectric layer from a bottom of the first and second recesses.

5. The method of claim 1, wherein the step of depositing the semiconductor material on the exposed substrate portion and in the second recess comprises depositing polycrystalline silicon on the exposed substrate portion and in the second recess.

6. The method of claim 1, wherein the step of depositing a first oxide-resistant layer on the first dielectric layer comprises depositing a layer of silicon nitride on the first dielectric layer.

7. The method of claim 1, wherein the step of depositing a semiconductor material on the exposed substrate portion and in the second recess comprises depositing polycrystalline silicon on the exposed substrate portion and in the second recess, wherein the polycrystalline silicon is deposited to a depth of approximately two-thirds of the second recess.

8. The method of claim 1, further including the step of etching back the oxidized semiconductor material.

9. A method for isolating regions of an integrated circuit comprising the steps of:
    forming a first recess in a substrate;
    forming a first dielectric layer in the first recess;
    depositing a first oxide-resistant layer on the first dielectric layer;
    forming an oxide layer on the first oxide-resistant layer, wherein the first dielectric layer, the first oxide-resistant layer and the oxide layer together form a second recess within the first recess;
    exposing a portion of the substrate via the first and second recesses;
    depositing a semiconductor material on the exposed substrate portion, on the oxide layer, and in the second recess; and
    oxidizing the semiconductor material.

10. The method of claim 9, wherein the step of forming a first recess in a substrate comprises the steps of:
    forming a second dielectric layer on the surface of the substrate;
    depositing a second oxide-resistant layer on the second dielectric layer in a pattern to expose a portion of a surface of the substrate; and
    removing the exposed portion of the substrate surface to form the first recess in the substrate, the first recess including a bottom and a plurality of sidewalls.

11. The method of claim 9, wherein the step of forming an oxide layer on a portion of the first oxide-resistant layer comprises the steps of:
    depositing the oxide layer on the first oxide-resistant layer; and
    etching the oxide layer such that sidewall spacers are formed along sides of the second recess.

12. The method of claim 9, wherein the step of exposing a portion of the substrate via the first and second recesses comprises removing a portion of the first oxide-resistant layer and a portion of the first dielectric layer from a bottom of the first and second recesses.

13. The method of claim 9, wherein the step of depositing the semiconductor material on the exposed substrate portion and in the second recess comprises depositing polycrystalline silicon on the exposed substrate portion and in the second recess.

14. The method of claim 9, wherein the step of depositing a first oxide-resistant layer on the first dielectric layer comprises depositing a layer of silicon nitride on the first dielectric layer.

15. The method of claim 9, wherein the step of depositing a semiconductor material on the exposed substrate portion and in the second recess comprises depositing polycrystalline silicon on the exposed substrate portion and in the second recess, wherein the polycrystalline silicon is deposited to a depth of approximately two-thirds of the second recess.

16. The method of claim 9, further including the step of etching back the oxidized semiconductor material.

17. A method for isolating regions of an integrated circuit comprising the steps of:

forming a first recess in a substrate;

forming a first dielectric layer in the first recess;

depositing a first oxide-resistant layer on the first dielectric layer;

forming an oxide layer on the first oxide-resistant layer, wherein the first dielectric layer, the first oxide-resistant layer and the oxide layer together form a second recess within the first recess;

forming sidewall spacers along the sides of the second recess;

exposing a portion of the first recess via the second recess without exposing the substrate therebelow;

depositing a polycrystalline silicon material on the exposed first recess, the sidewall spacers and in the second recess; and oxidizing the polycrystalline silicon material.

18. The method of claim 17, wherein the step of forming a first recess in a substrate comprises the steps of:

forming a second dielectric layer on the surface of the substrate;

depositing a second oxide-resistant layer on the second dielectric layer in a pattern to expose a portion of a surface of the substrate; and removing the exposed portion of the substrate surface to form the first recess in the substrate, the first recess including a bottom and a plurality of sidewalls.

19. The method of claim 17, wherein the step of forming an oxide layer on a portion of the first oxide-resistant layer comprises the steps of:

depositing the oxide layer on the first oxide-resistant layer; and etching the oxide layer such that sidewall spacers are formed along sides of the second recess.

20. The method of claim 17, wherein the step of exposing a portion of the first recess via the second recess comprises removing a portion of the first oxide-resistant layer from a bottom of the second recess.

21. The method of claim 17, wherein the step of depositing a first oxide-resistant layer on the first dielectric layer comprises depositing a layer of silicon nitride on the first dielectric layer.

22. The method of claim 17, wherein the polycrystalline silicon is deposited to a depth of approximately two-thirds of the second recess.

23. The method of claim 17, further including the step of etching back the oxidized semiconductor material.

* * * * *